US011373697B2

(12) United States Patent
Lim et al.

(10) Patent No.: US 11,373,697 B2
(45) Date of Patent: Jun. 28, 2022

(54) SEMICONDUCTOR MEMORY DEVICE HAVING PLURALITY OF ADDRESS STORING CIRCUITS FOR STORING SAMPLING ADDRESS AS LATCH ADDRESSES AND A DUPLICATION DECISION CIRCUIT, AND METHOD OF REFRESHING OPERATION

(71) Applicant: SK hynix Inc., Gyeonggi-do (KR)

(72) Inventors: Jung Ho Lim, Gyeonggi-do (KR); Ja Beom Koo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/070,131

(22) Filed: Oct. 14, 2020

(65) Prior Publication Data

US 2021/0375346 A1 Dec. 2, 2021

(30) Foreign Application Priority Data

Jun. 2, 2020 (KR) .................. 10-2020-0066498

(51) Int. Cl.
*G11C 11/406* (2006.01)
*G11C 11/408* (2006.01)

(52) U.S. Cl.
CPC ........ *G11C 11/406* (2013.01); *G11C 11/4085* (2013.01)

(58) Field of Classification Search
CPC .......................... G11C 11/406; G11C 11/4085
USPC .............. 365/149, 222, 230.08, 230.06
See application file for complete search history.

(56) References Cited

U.S. PATENT DOCUMENTS

| 8,923,084 B1* | 12/2014 | Song ............... G11C 11/40611 365/222 |
| 9,396,786 B2* | 7/2016 | Yoon ................ G11C 11/40615 |
| 10,388,363 B1 | 8/2019 | Ito |
| 11,094,369 B1* | 8/2021 | Joo ..................... G11C 11/4082 |

FOREIGN PATENT DOCUMENTS

KR 10-2018-0092513 8/2018

* cited by examiner

*Primary Examiner* — Connie C Yoha
(74) *Attorney, Agent, or Firm* — IP & T Group LLP

(57) ABSTRACT

A semiconductor memory device includes a cell array including a plurality of word lines; a plurality of address storing circuits suitable for sequentially storing a sampling address as one of a plurality of latch addresses, and sequentially outputting each of the latch addresses as a target address according to a refresh command; a duplication decision circuit suitable for preventing the sampling address from being stored in the address storing circuits when the sampling address is identical to any of the latch addresses stored in the address storing circuits; and a row control circuit suitable for refreshing one or more word lines based on the target address in response to the refresh command.

22 Claims, 11 Drawing Sheets

SEMICONDUCTOR MEMORY DEVICE HAVING PLURALITY OF ADDRESS STORING CIRCUITS FOR STORING SAMPLING ADDRESS AS LATCH ADDRESSES AND A DUPLICATION DECISION CIRCUIT, AND METHOD OF REFRESHING OPERATION

CROSS-REFERENCE TO RELATED APPLICATIONS

The present application claims priority to Korean Patent Application No. 10-2020-0066498, filed on Jun. 2, 2020, which is incorporated herein by reference in its entirety.

BACKGROUND

1. Field

Various embodiments described herein relate to a semiconductor memory device and a method for a semiconductor memory device for performing a refresh operation.

2. Description of the Related Art

Semiconductor memory devices include a plurality of memory cells. Each memory cell may include a transistor serving as a switch and a capacitor storing a charge (i.e., data). The data may have one of two logic levels, namely a high logic level (e.g., Logic 1) and a low logic level (Logic 0). The logic level of the data may depend on whether or not charge is stored in the capacitor, that is, whether the terminal voltage of the capacitor is high or low.

Since data are stored in the form of charges accumulated in the capacitor, theoretically storing data should not consume power. However, due to current leakage caused by a PN coupling of the transistor, an initial amount of charge stored in the capacitor of each memory cell may not be stably maintained. As a result, data stored in the memory cell may be lost. In an attempt to prevent losing data, data in the memory cell may be read before the data is lost and the capacitor may be recharged to ensure that a sufficient amount of charge is stored. This operation may be performed repeatedly at predetermined periods to retain accuracy of the data. The process of recharging a memory cell may be referred to as a refresh operation, e.g., a 'normal refresh operation'.

In addition to performing normal refresh operations, 'target refresh operations' may be performed on memory cells of word lines that are likely to lose data due to a row hammering phenomenon. Row hammering refers to a phenomenon in which data of memory cells coupled to a same word line, or word lines adjacent to a particular word line, are damaged or distorted due to a high activation frequency of that word line. To prevent row hammering, target refresh operations may be performed on a word line which is frequently activated (e.g., a predetermined number of times or more) or on adjacent word lines.

SUMMARY

Various embodiments are directed to a semiconductor memory device capable of preventing a duplicated address from being stored in an address storing circuit and performing a target refresh using stored addresses in the address storing circuit, and a method for operating the semiconductor memory device.

In accordance with an embodiment, a semiconductor memory device includes: a cell array including a plurality of word lines; a plurality of address storing circuits suitable for sequentially storing a sampling address as one of a plurality of latch addresses, and sequentially outputting each of the latch addresses as a target address according to a refresh command; a duplication decision circuit suitable for preventing the sampling address from being stored in the address storing circuits when the sampling address is identical to any of the latch addresses stored in the address storing circuits; and a row control circuit suitable for refreshing one or more word lines based on the target address in response to the refresh command.

In accordance with an embodiment, an address generation circuit includes: a plurality of address storing circuits suitable for storing a sampling address as one of a plurality of latch addresses according to a counting signal, and outputting each of the latch addresses as a target address according to a refresh command and a sequential signal; a duplication decision circuit suitable for preventing the sampling address from being stored in the address storing circuits when the sampling address is identical to any of the latch addresses stored in the address storing circuits; and a control signal generation circuit suitable for sequentially activating bits within the counting signal and sequentially activating bits within the sequential signal, in response to the refresh command.

In accordance with an embodiment, a method for operating a semiconductor memory device including a plurality of address storing circuits, includes: generating a duplication decision signal according to whether a sampling address is identical to any of a plurality of latch addresses stored in the address storing circuits; sequentially storing the sampling address as one of the plurality of latch addresses in the address storing circuits according to a counting signal and the duplication decision signal; and sequentially outputting the latch addresses as a target address according to a refresh command and a sequential signal and refreshing one or more word lines based on the target address.

In accordance with an embodiment, an operating method of a memory device, includes: selectively latching individual ones among sequentially provided addresses such that the latched addresses are different from one another; and performing refresh operations on word lines indicated by a sequence of the latched addresses.

These and other features and advantages of the embodiments disclosed herein will be better understood by those with ordinary skill in the field relating to the following detailed description in conjunction with the accompanying drawings.

DETAILED DESCRIPTION

Figure 1:
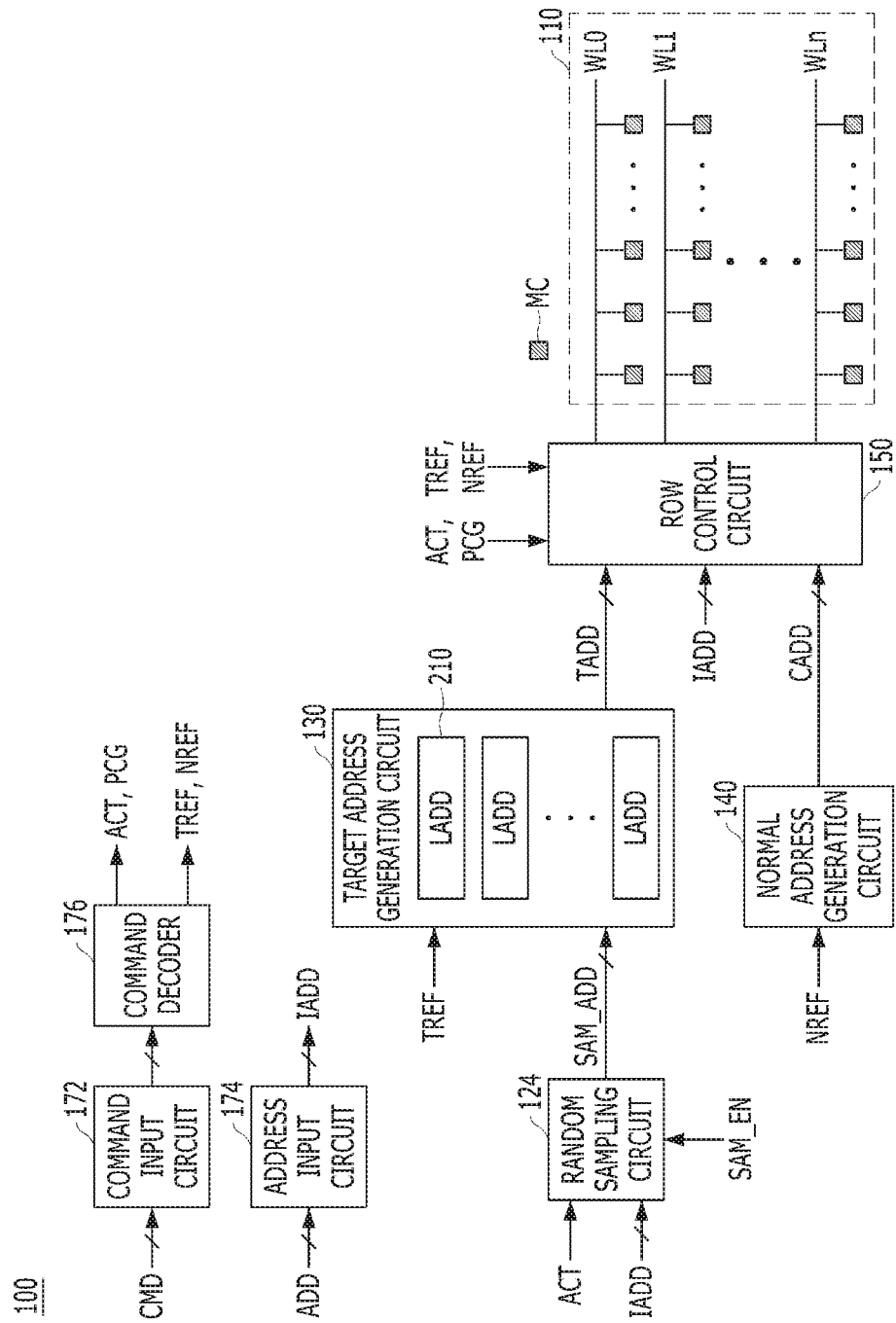
FIG. 1 is a block diagram illustrating a semiconductor memory device in accordance with an embodiment of the present invention.

Various embodiments will be described below in more detail with reference to the accompanying drawings. The subject matter described, however, may be embodied in different forms and should not be construed as limited to the embodiments set forth herein. Rather, these embodiments are provided so that this disclosure will be thorough and complete, and will fully convey the scope of the described subject matter to those skilled in the art. Throughout the disclosure, like reference numerals refer to like parts throughout the various figures and embodiments.

It is noted that reference to "an embodiment," "another embodiment" or the like does not necessarily mean only one embodiment, and different references to any such phrase are not necessarily to the same embodiment(s).

It should also be noted that features present in one embodiment may be used with one or more features of another embodiment without departing from the scope of the invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the described subject matter.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should be construed to mean 'one or more' unless specified otherwise or it is clear from context to be directed to a singular form.

In one or more embodiments, an operation to sequentially refresh a plurality of word lines of a memory device may be defined as a normal refresh operation, and an operation to refresh one or more word lines adjacent to a word line with relatively high activation frequency, hereinafter referred to as a "high active word line", may be defined as a target refresh operation.

Figure 2:
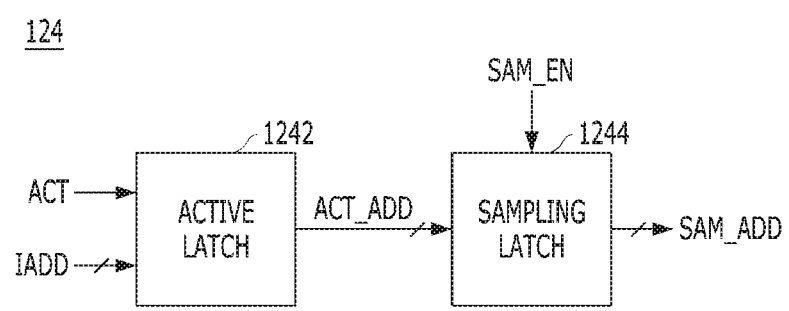
FIG. 2 is a detailed block diagram illustrating a random sampling circuit of FIG. 1.

FIG. 1 is a block diagram illustrating a semiconductor memory device 100 in accordance with an embodiment of the present invention. FIG. 2 is a detailed block diagram illustrating a random sampling circuit 124 of FIG. 1.

Referring to FIG. 1, the semiconductor memory device 100 may include a cell array 110, a random sampling circuit 124, a target address generation circuit 130, a normal address generation circuit 140, a row control circuit 150, a command input circuit 172, an address input circuit 174, and a command decoder 176.

The cell array 110 may include a plurality of word lines WL0 to WLn, each coupled to one or more memory cells MC. The cell array 110 may also include a plurality of bit lines (not shown), each coupled to one or more of the memory cells MC.

The command input circuit 172 may receive a command CMD, and the address input circuit 174 may receive an address ADD. The address input circuit 174 may receive the address ADD and output an internal input address IADD. Each of the command CMD and the address ADD may include a multi-hit signal. The command decoder 176 may decode the command CMD inputted through the command input circuit 172 and may generate an active command ACT, a precharge command PCG, a normal refresh command NREF, and a target refresh command TREF. The command decoder 176 may generate a read command and a write command, as well as other commands, by decoding received commands CMD.

The random sampling circuit 124 may store the input address IADD as an active address (ACT_ADD of FIG. 2) according to the active command ACT, and output the active address ACT_ADD as a sampling address SAM_ADD according to a random sampling signal SAM_EN that is enabled at a random point of time. That is, the random sampling circuit 124 may generate the sampling address SAM_ADD by sampling (i.e., outputting) the input address IADD, inputted together with the active command ACT, at the random point. For reference, the input address IADD, inputted together with the active command ACT, may indicate a word line, hereinafter, an "active word line", to be activated in response to the active command ACT. If an address of an active word line is stored at a random point of time, a target refresh operation may be performed on the active word line corresponding to the stored address and/or one or more word lines adjacent to the active word line. Thus, in at least one embodiment, it may not be necessary to count the number of all activated word lines in order to perform a target refresh operation. Implementing such approach without a counter to count the number of all activated word lines allows the size of the memory device to be substantially reduced or minimized. At the same time, this approach prevents word line disturbance that may otherwise occur with at least a certain probability due to the row hammering phenomenon. While embodiments which perform sampling at one or more random points have been discussed, sampling may be performed at one or more set points and/or with a set frequency in other embodiments.

Referring to FIG. 2, the random sampling circuit 124 may include an active latch 1242 and a sampling latch 1244. The active latch 1242 may store the input address IADD as the active address ACT_ADD according to the active command ACT. The sampling latch 1244 may output the active address ACT_ADD as the sampling address SAM_ADD according to the random sampling signal SAM_EN. In an embodiment, each of the active latch 1242 and the sampling latch 1244 may be composed of a plurality of flip-flops respectively corresponding to bits of the active address ACT_ADD or the sampling address SAM_ADD. For example, the active latch 1242 may be composed of a plurality of flip-flops for latching the input address IADD to output the active address ACT_ADD when the active command ACT is activated. The sampling latch 1244 may be composed of a plurality of flip-flops for latching the active address ACT_ADD to output the sampling address SAM_ADD when the random sampling signal SAM_EN is enabled.

Referring back to FIG. 1, the target address generation circuit 130 may store the sampling address SAM_ADD as latch addresses LADD. The target address generation circuit 130 may sequentially output the latch addresses LADD as a target address TADD according to the target refresh command TREF. The target address generation circuit 130 may include a plurality of address storing circuits 210, each for storing a corresponding latch address LADD. In an embodiment, the address storing circuit 210 may sequentially store the sampling address SAM_ADD, the stored sampling addresses SAM_ADD being the latch addresses LADD, and sequentially output the latch addresses LADD as the target address TADD according to the target refresh command TREF. In another embodiment, the target address TADD may indicate an address of a word line to be activated and refreshed during a target refresh operation. The target address TADD may indicate, for example, an address of a high active word line. During the target refresh operation, one or more word lines adjacent to the high active word line may be refreshed. When the sampling address SAM_ADD is duplicated with, i.e., the same as, at least one of the latch addresses LADD stored in the address storing circuit 210, the target address generation circuit 130 may control/manage not to store the duplicated sampling address SAM_ADD in the address storing circuit 210. The detailed configuration and operation of the target address generation circuit 130 will be described in FIGS. 3 to 8.

The normal address generation circuit 140 may generate a counting address CADD having a value that changes based on refreshing of any of the word lines WL0 to WLn. For example, the normal address generation circuit 140 may increase a value of the counting address CADD by +1 whenever the normal refresh command NREF is activated. The counting address CADD may indicate an address of a word line to be activated and refreshed during a normal refresh operation. The normal address generation circuit 140 may change the value of the counting address CADD such that a (K+1)th word line WLK+1 is selected when a K-th word line WLK was previously selected.

The row control circuit 150 may activate a word line corresponding to the input address IADD in response to activation of the active command ACT, and may precharge the activated word line in response to the precharge command PCG. The row control circuit 150 may activate and refresh a word line corresponding to the counting address CADD in response to the normal refresh command NREF, and may activate and refresh a word line corresponding to the target address TADD in response to the target refresh command TREF. The row control circuit 150 may refresh one or more adjacent word lines corresponding to addresses calculated, for example, by adding or subtracting a value of 1 from the target address TADD. Although FIG. 1 shows that the target address generation circuit 130 outputs the latch address LADD as the target address TADD, variations are possible. In an embodiment, the target address generation circuit 130 may provide the target address TADD to the row control circuit 150 by adding or subtracting a value of 1 from the latch address LADD.

As described above, the semiconductor memory device 100 may sequentially perform a normal refresh on the word lines WL0 to WLn in response to the normal refresh command NREF inputted periodically, and perform a target refresh on a word line in response to the target refresh command TREF. At this time, the semiconductor memory device 100 may store the sampling address SAM_ADD which is randomly sampled, the stored sampling addresses SAM_ADD being the latch addresses LADD, and may use the latch addresses LADD to perform the target refresh operation, thereby reducing the possibility of word line disturbance, and reducing or minimizing the size of the memory device 100. In particular, when the sampling address SAM_ADD is duplicated with at least one of the latch addresses LADD stored in the address storing circuit 210, the semiconductor memory devices 100 may mask/block, e.g., prevent, the duplicated sampling address SAM_ADD from being stored in the address storing circuit 210. Thus, it is possible to improve the efficiency of the target refresh operation by preventing unnecessary refresh operations from being performed due to the duplicated sampling address SAM_ADD that is the same as the latch addresses LADD stored in the address storing circuit 210.

Hereinafter, referring to FIGS. 3 to 8, the detailed configuration and operation of the target address generation circuit 130 will be described. For the convenience of description, a case where the target address generation circuit 130 has 5 address storing circuits will be described as an example.

Figure 3:
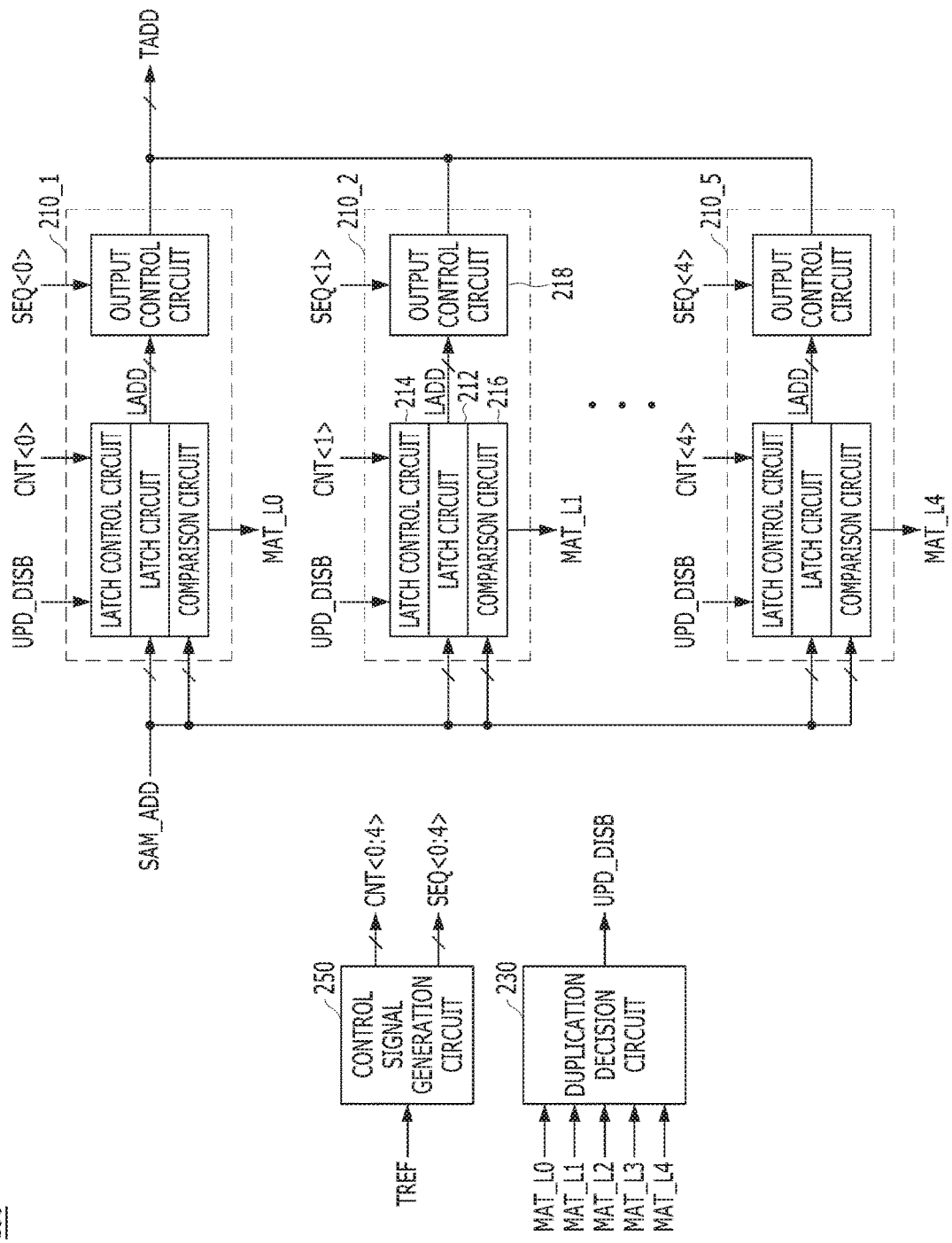
FIG. 3 is a detailed block diagram illustrating a target address generation circuit of FIG. 1.
Figure 4:
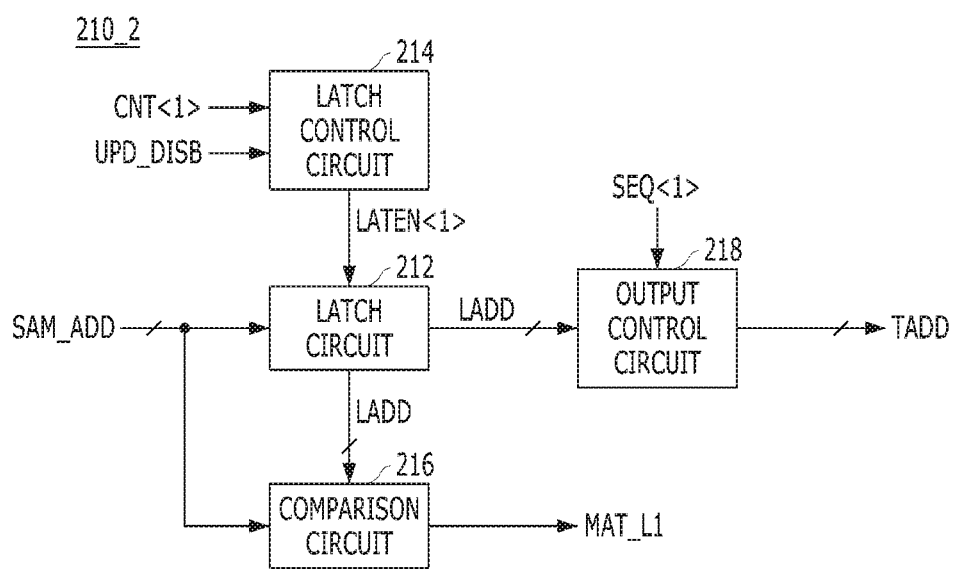
FIG. 4 is a detailed block diagram illustrating an address storing circuit of FIG. 3.
Figure 5:
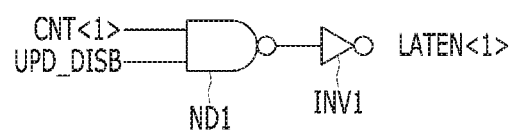
FIG. 5 is a detailed circuit diagram illustrating a latch control circuit of FIG. 4.
Figure 6:
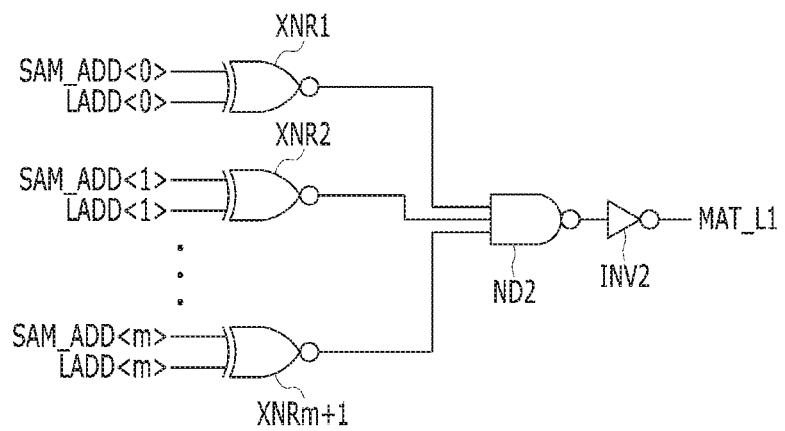
FIG. 6 is a detailed circuit diagram illustrating a comparison circuit of FIG. 4.

FIG. 3 is a detailed block diagram illustrating the target address generation circuit 130 of FIG. 1. FIG. 4 is a detailed block diagram illustrating a second address storing circuit 210_2 of FIG. 3. FIG. 5 is a detailed circuit diagram illustrating the latch control circuit 214 of FIG. 4. FIG. 6 is a detailed circuit diagram illustrating the comparison circuit 216 of FIG. 4.

Referring to FIG. 3, the target address generation circuit 130 may include first to fifth address storing circuits 210_1 to 210_5, duplication decision circuit 230, and a control signal generation circuit 250.

The control signal generation circuit 250 may sequentially activate bits within a counting signal CNT<0:4> whenever the target refresh command TREF is activated. The control signal generation circuit 250 may sequentially activate bits within a sequential signal SEQ<0:4> whenever the target refresh command TREF is activated. In an embodiment, each of the counting signal CNT<0:4> and the sequential signal SEQ<0:4> may be composed of bits corresponding to the number, e.g., '5', of the address storing circuits 210_1 to 210_5. That is, each of the first to fifth address storing circuits 210_1 to 210_5 may receive a corresponding bit of the counting signal CNT<0:4> and a corresponding bit of the sequential signal SEQ<0:4>. For example, the second address storing circuit 210_2 may receive the second bit CNT<1> of the counting signal CNT<0:4> and the second bit SEQ<1> of the sequential signal SEQ<0:4>.

The control signal generation circuit 250 may generate the counting signal CNT<0:4> and the sequential signal SEQ<0:4> such that corresponding bits thereof are activated at different points in time. For example, the control signal generation circuit 250 may activate the first bit CNT<0> of the counting signal CNT<0:4> and the fifth bit SEQ<4> of the sequential signal SEQ<0:4> when the target refresh command TREF is activated once. The control signal generation circuit 250 may activate the second bit CNT<1> of the counting signal CNT<0:4> and the first bit SEQ<0> of the sequential signal SEQ<0:4> when the target refresh command TREF is activated twice. In this way, the control signal generation circuit 250 may activate the k-th bit CNT<k−1> of the counting signal CNT<0:4> and the (k−1)-th bit SEQ<k−2> of the sequential signal SEQ<0:4> when the target refresh command TREF is activated k times. The detailed configuration and operation of the control signal generation circuit 250 will be described in FIGS. 8 and 9.

Each of the first to fifth address storing circuits 210_1 to 210_5 may include a latch circuit 212, a latch control circuit 214, a comparison circuit 216, and an output control circuit 218. Since the first to fifth address storing circuits 210_1 to 210_5 include substantially the same configuration, the second address storing circuit 210_2 will be described as an example.

Referring to FIG. 4, the latch circuit 212 may store the sampling address SAM_ADD as the latch address LADD according to a latch enable signal LATEN<1>. The latch circuit 212 may store the sampling address SAM_ADD as the latch address LADD when the latch enable signal LATEN<1> is enabled, and may discard the sampling address SAM_ADD without storing the sampling address SAM_ADD when the latch enable signal LATEN<1> is disabled. The latch circuit 212 may be composed of latches corresponding to bits of the sampling address SAM_ADD.

The latch control circuit 214 may generate the latch enable signal LATEN<1> according to a duplication decision signal UPD_DISB and a corresponding bit (i.e., the second bit CNT<1>) of the counting signal CNT<0:4>. The latch control circuit 214 may enable the latch enable signal LATEN<1> when the duplication decision signal UPD_DISB is disabled and the second bit CNT<1> is activated. The latch control circuit 214 may disable the latch enable signal LATEN<1> when the duplication decision signal UPD_DISB is enabled regardless of the second bit CNT<1>. The duplication decision signal UPD_DISB may be enabled to a logic low level. For example, referring to FIG. 5, the latch control circuit 214 may include a first NAND gate ND1 and a first inverter INV1. The first NAND gate ND1 and the first inverter INV1 may perform a logic AND operation on the duplication decision signal UPD_DISB and the second bit CNT<1>. Thus, the latch control circuit 214 may enable the latch enable signal LATEN<1> to a logic high level when the duplication decision signal UPD_DISB is disabled to a logic high level, and the second bit CNT<1> is activated to a logic high level.

The comparison circuit 216 may output a second match signal MAT_L1 by comparing the sampling address SAM_ADD with the latch address LADD stored in the latch circuit 212. The comparison circuit 216 may enable the second match signal MAT_L1 to a logic high level when all bits of the sampling address SAM_ADD are respectively identical to all bit of the latch address LADD. For example, referring to FIG. 6, the comparison circuit 216 may include a plurality of exclusive NOR gates XNR1 to XNRm+1, a second NAND gate ND2, and a second inverter INV2, where m is greater than 0. Each of the exclusive NOR gates XNR1 to XNRm+1 may output an output signal of a logic high level when a corresponding bit of the sampling address SAM_ADD is identical to a corresponding bit of the latch address LADD. The second NAND gate ND2 and the second inverter INV2 may perform a logic AND operation on the output signals of the exclusive NOR gates XNR1 to XNRm+1. Thus, the comparison circuit 216 may enable the second match signal MAT_L1 to a logic high level when the respective bits of the sampling address SAM_ADD are identical to the respective bits of the latch address LADD.

The output control circuit 218 may output the latch address LADD as the target address TADD according to a corresponding bit (i.e., the second bit SEQ<1>) of the sequential signal SEQ<0:4>.

Referring back to FIG. 3, the duplication decision circuit 230 may mask/block the sampling address SAM_ADD from being stored in the first to fifth address storing circuits 210_1 to 210_5 when the sampling address SAM_ADD is identical to any of the latch addresses LADD stored in the first to fifth address storing circuits 210_1 to 210_5. That is, the duplication decision circuit 230 may control the sampling address SAM_ADD not to be stored in the first to fifth address storing circuits 210_1 to 210_5 when the sampling address SAM_ADD is identical to any of the latch addresses LADD. In an embodiment, the duplication decision circuit 230 may enable the duplication decision signal UPD_DISB when any of first to fifth match signals MAT_L0 to MAT_L4 outputted from the first to fifth address storing circuits 210_1 to 210_5 is enabled. Meanwhile, the latch control circuit 214 of each of the first to fifth address storing circuits 210_1 to 210_5 may disable the latch enable signal LATEN<0:4> when the duplication decision signal UPD_DISB is enabled to a logic low level regardless of the counting signal CNT<0:4>. Accordingly, the sampling address SAM_ADD is not stored in the first to fifth address storing circuits 210_1 to 210_5.

Figure 7:
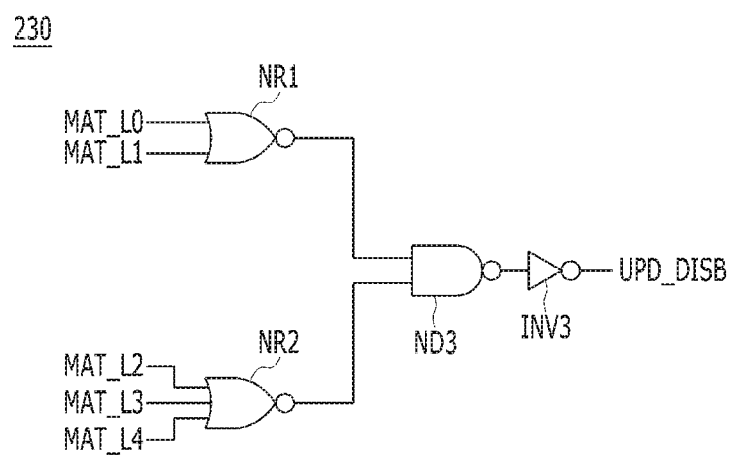
FIG. 7 is a detailed circuit diagram illustrating a duplication decision circuit of FIG. 3.

FIG. 7 is a detailed circuit diagram illustrating the duplication decision circuit 230 of FIG. 3.

Referring to FIG. 7, the duplication decision circuit 230 may include first and second NOR gates NR1 and NR2, a third NAND gate ND3, and a third inverter INV3. Each of the first and second NOR gates NR1 and NR2 may output an output signal of a logic low level when any of input signals among the first to fifth match signals MAT_L0 to MAT_L4 is enabled to a logic high level. Each of the first and second NOR gates NR1 and NR2 may output the output signal of a logic high level when all of the input signals among the first to fifth match signals MAT_L0 to MAT_L4 are disabled to a logic low level. The third NAND gate ND3 and the third inverter INV3 may perform a logic AND operation on the output signals of the first and second NOR gates NR1 and NR2, and output the duplication decision signal UPD_DISB.

As described above, the duplication decision circuit 230 may enable the duplication decision signal UPD_DISB to a logic low level when any of the first to fifth match signals MAT_L0 to MAT_L4 is enabled to a logic high level. The duplication decision circuit 230 may disable the duplication decision signal UPD_DISB to a logic high level when all of the first to fifth match signals MAT_L0 to MAT_L4 are disabled to a logic low level.

Figure 8:
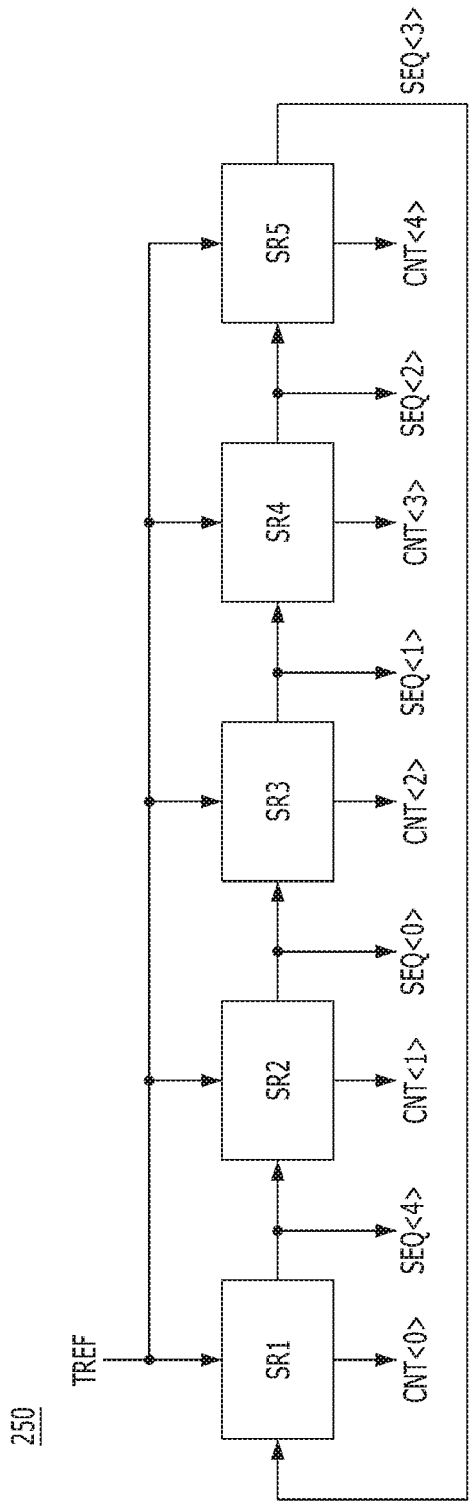
FIG. 8 is a block diagram illustrating a control signal generation circuit of FIG. 3.
Figure 9:
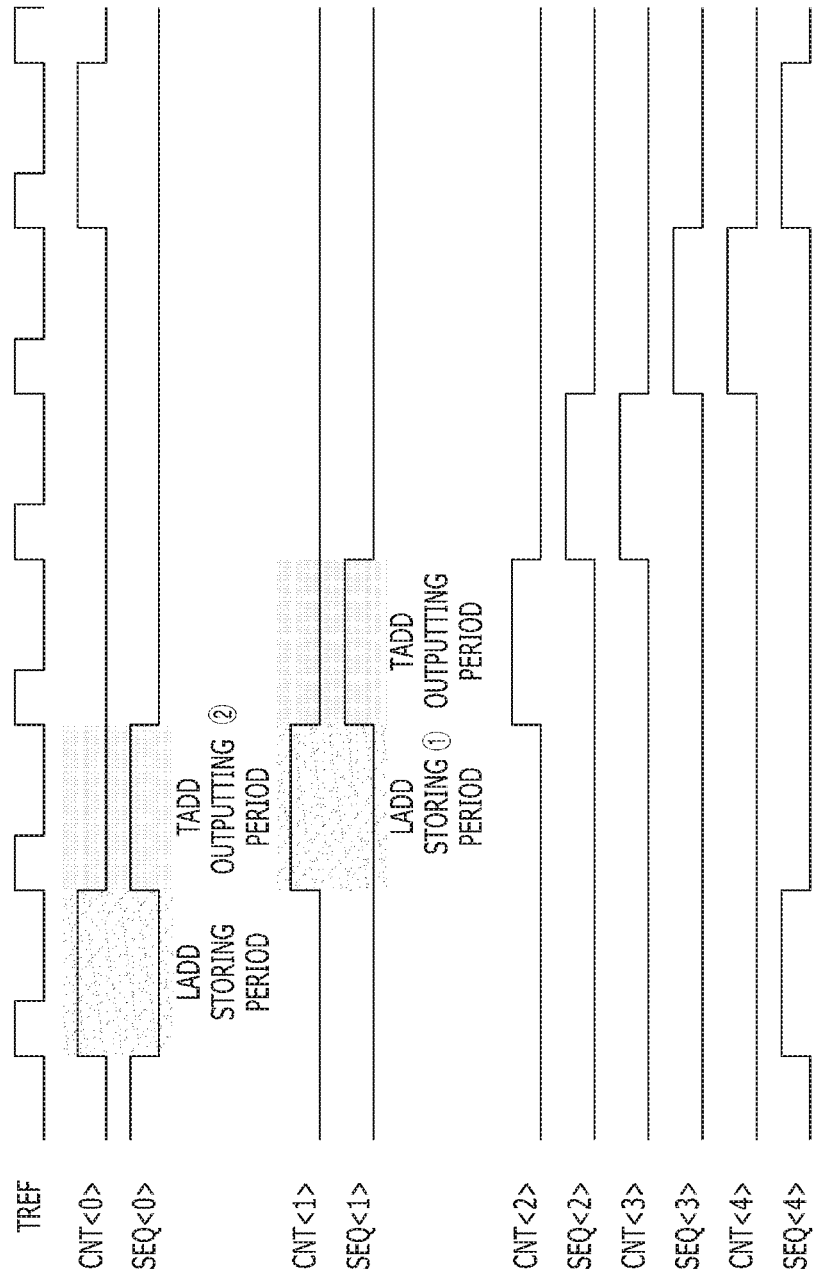
FIG. 9 is a waveform diagram for describing an operation of the control signal generation of FIG. 8.

FIG. 8 is a block diagram illustrating the control signal generation circuit 250 of FIG. 3. FIG. 9 is a waveform diagram for describing an operation of the control signal generation 250 of FIG. 8.

Referring to FIG. 8, the control signal generation circuit 250 may include a plurality of shift registers SR1 to SR5 coupled in series. The number of the shift registers SR1 to SR5 may correspond to the number of bits within the counting signal CNT<0:4> or the sequential signal SEQ<0:4>. For example, when the counting signal CNT<0:4> or the sequential signal SEQ<0:4> is composed of 5 bits, 5 shift registers SR1 to SR5 are provided.

The first to fifth shift registers SR1 to SR5 may form a ring-type counter. That is, each of the second to fifth shift registers SR2 to SR5 may receive an output signal of a shift register at a previous stage, as an input signal, and the first shift register SR1 may receive an output signal of the fifth shift register SR5 at a last stage. Each of the first to fifth shift registers SR1 to SR5 may shift the corresponding input signal to a shift register at a next stage according to the target refresh command TREF. In an embodiment, the k-th bit CNT<k−1> of the counting signal CNT<0:4> and the (k−1)- th bit SEQ<k−2> of the sequential signal SEQ<0:4> may be outputted from the k-th shift register.

Referring to FIG. 9, when the target refresh command TREF is activated once, the first shift register SR1 activates the first bit CNT<0> of the counting signal CNT<0:4> and the fifth bit SEQ<4> of the sequential signal SEQ<0:4>. When the target refresh command TREF is activated twice, the second shift register SR2 activates the second bit CNT<1> of the counting signal CNT<0:4> and the first bit SEQ<0> of the sequential signal SEQ<0:4>. In this way, when the target refresh command TREF is activated k times, the k-th shift register activates the k-th bit CNT<k−1> of the counting signal CNT<0:4> and the (k−1)-th bit SEQ<k−2> of the sequential signal SEQ<0:4>. That is, the k-th bit CNT<k−1> of the counting signal CNT<0:4> and the k-th bit SEQ<k−1> of the sequential signal SEQ<0:4> may be sequentially activated at different points in time.

The counting signal CNT<0:4> may be a signal that is enabled to sequentially store the sampling address SAM_ADD in the latch circuits 212, the stored sampling addresses SAM_ADD being the latch addresses LADD. The sequential signal SEQ<0:4> may be a signal that is enabled to sequentially output the latch addresses LADD as the target address TADD from the latch circuits 212. In an embodiment, the control signal generation circuit 250 may generate the counting signal CNT<0:4> and the sequential signal SEQ<0:4> such that corresponding bits thereof are sequentially activated at different points in time. In particular, as shown in FIGS. 8 and 9, the control signal generation circuit 250 may sequentially activate the counting signal CNT<0:4> and the sequential signal SEQ<0:4> such that the k-th bit CNT<k−1> of the counting signal CNT<0:4> and the (k−1)-th bit SEQ<k−2> of the sequential signal SEQ<0:4> are activated at the same time. Accordingly, during a period in which the k-th address storing circuit stores therein the sampling address SAM_ADD as a corresponding latch address LADD (see "LADD STORING PERIOD ①"), the (k−1)-th address storing circuit may output therefrom a corresponding latch address LADD as the target address TADD (see "TADD OUTPUTTING PERIOD ②").

Hereinafter, referring to FIGS. 1 to 11, an address storing operation of a semiconductor memory device will be described.

Figure 10:
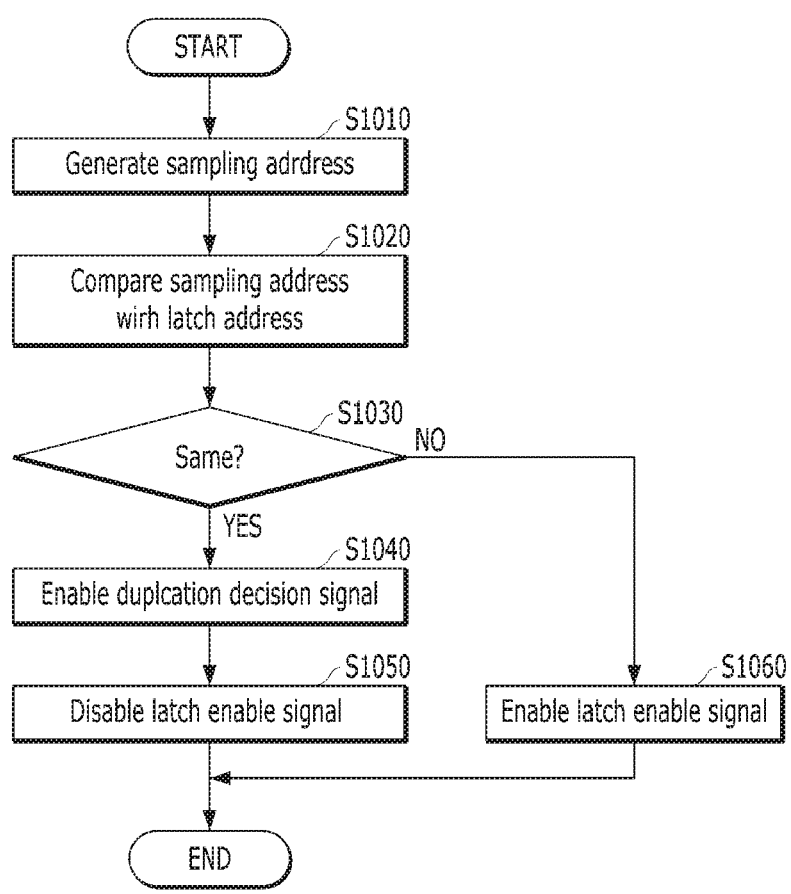
FIG. 10 is a flow chart for describing an operation of a semiconductor memory device in accordance with an embodiment of the present invention.

FIG. 10 is a flow chart for describing an operation of a semiconductor memory device in accordance with an embodiment of the present invention.

Referring to FIG. 10, the random sampling circuit 124 may store the input address IADD as the active address ACT_ADD according to the active command ACT, and output the active address ACT_ADD as the sampling address SAM_ADD according to the random sampling signal SAM_EN at a random point of time (at operation S1010).

The comparison circuits 216 of the first to fifth address storing circuits 210_1 to 210_5 may generate the first to fifth match signals MAT_L0 to MAT_L4 by comparing the sampling address SAM_ADD with the latch addresses LADD stored the respective latch circuits 212 (at operation S1020). When the sampling address SAM_ADD is identical to any of the latch addresses LADD, the corresponding match signal may be enabled.

When any of the first to fifth match signals MAT_L0 to MAT_L4 is enabled ("YES" of S1030), the duplication decision circuit 230 may enable the duplication decision signal UPD_DISB to a logic low level (at operation S1040). The latch control circuits 214 of the first to fifth address storing circuits 210_1 to 210_5 may disable the latch enable signal LATEN<0:4> (at operation S1050) regardless of the counting signal CNT<0:4>. Accordingly, the sampling address SAM_ADD may be not stored in the latch circuits 212 of the first to fifth address storing circuits 210_1 to 210_5.

When all of the first to fifth match signals MAT_L0 to MAT_L4 are disabled ("NO" of S1030), the duplication decision circuit 230 may disable the duplication decision signal UPD_DISB to a logic high level and the latch control circuits 214 may selectively activate any bit of the latch enable signal LATEN<0:4> according to the counting signal CNT<0:4> (at operation S1060). Accordingly, the sampling address SAM_ADD may be stored as the latch address LADD in the latch circuit 212 of one address storing circuit selected from the first to fifth address storing circuits 210_1 to 210_5 according to the activated bit of the counting signal CNT<0:4>.

Figure 11:
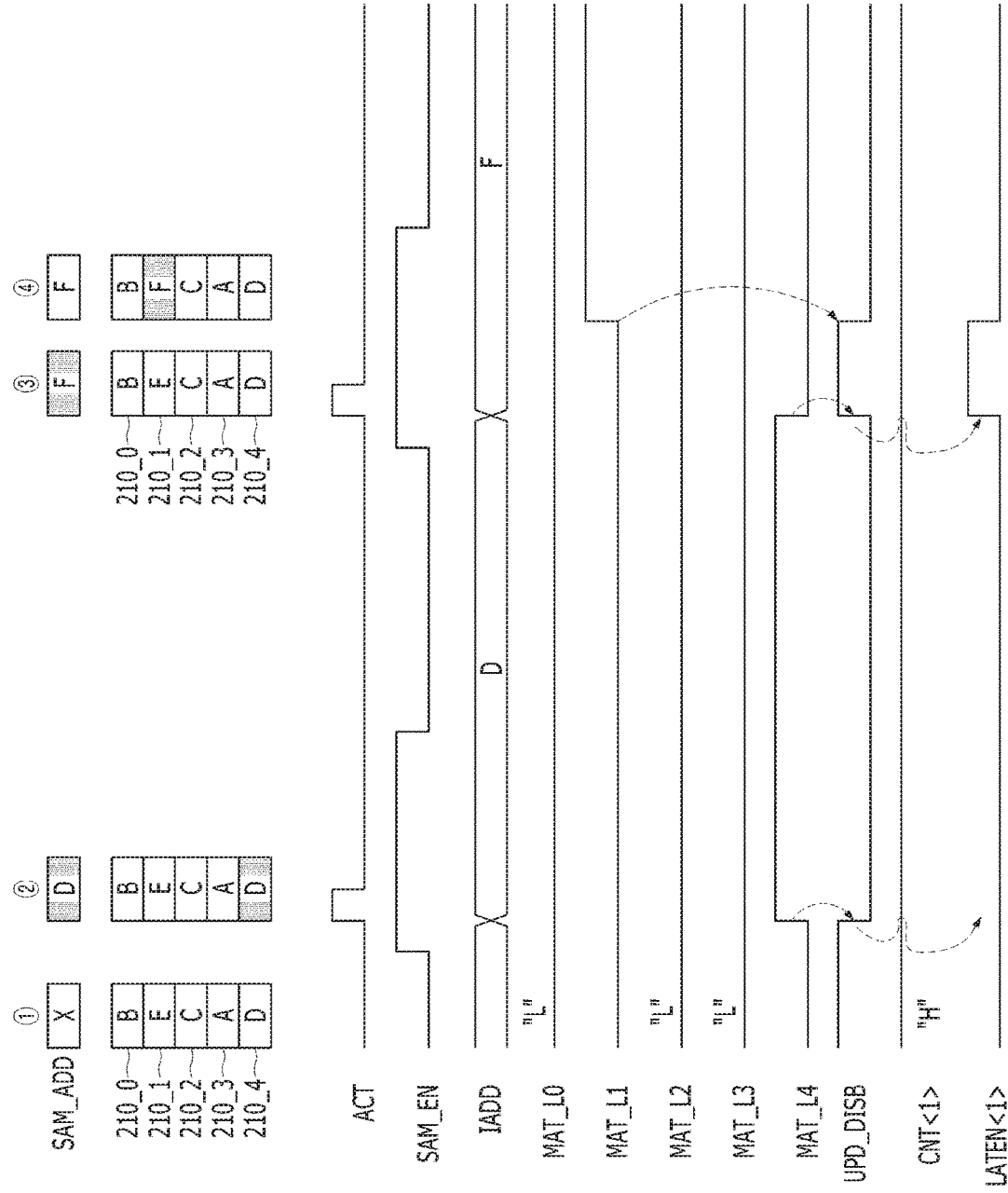
FIG. 11 is a timing diagram for describing the operation of the semiconductor memory device of FIG. 10.

FIG. 11 is a timing diagram for describing the operation of the semiconductor memory device of FIG. 10, in detail. In FIG. 11, a case where the second bit CNT<1> of the counting signal CNT<0:4> is activated to perform an address storing operation of the second address storing circuit 210_2 among the first to fifth address storing circuits 210_1 to 210_5, is described.

Referring to FIG. 11, at a first timing (①), the latch addresses LADD "B", "E", "C", "A", and "D" are respectively stored in the first to fifth address storing circuits 210_1 to 210_5.

At a second timing (②), the sampling address SAM_ADD "D" is generated by sampling the input address IADD "D" inputted together with the active command ACT according to the random sampling signal SAM_EN. Since the sampling address SAM_ADD "D" is identical to the latch address LADD "D" stored in the fifth address storing circuit 210_5, the fifth match signal MAT_L4 is enabled to a logic high level. Accordingly, the duplication decision signal UPD_DISB is enabled to a logic low level, and the latch enable signal LATEN<1> is disabled to a logic low level. As a result, the sampling address SAM_ADD "D" is not stored in the second address storing circuit 210_2 even if the second bit CNT<1> of the counting signal CNT<0:4> is activated.

At a third timing (③), the sampling address SAM_ADD "F" is generated by sampling the input address IADD "F" inputted together with the active command ACT according to the random sampling signal SAM_EN. Since the sampling address SAM_ADD "F" is different from any of the latch addresses LADD stored in the first to fifth address storing circuits 210_1 to 210_5, all of the first to fifth match signals MAT_L0 to MAT_L4 are disabled to a logic low level. Accordingly, the duplication decision signal UPD_DISB is disabled to a logic high level, and the latch enable signal LATEN<1> is enabled to a logic high level according to the second bit CNT<1> of the counting signal CNT<0:4>. As a result, the sampling address SAM_ADD "F" is stored in the second address storing circuit 210_2.

At a fourth timing (④) after the address storing operation of the second address storing circuit 210_2 is completed, the sampling address SAM_ADD "F" is identical to the latch address LADD "F" stored in the second address storing circuit 210_2. Accordingly, the second match signal MAT_L1 is enabled to a logic high level, and the duplication decision signal UPD_DISB is enabled to a logic low level. Thus, the latch enable signal LATEN<1> is disabled to a logic low level.

Figure 12:
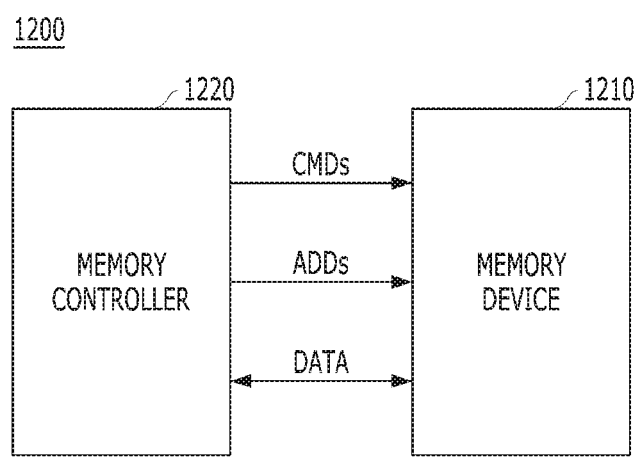
FIG. 12 is a block diagram illustrating a memory system in accordance with an embodiment of the present invention.

FIG. 12 is a block diagram illustrating a memory system 1200 in accordance with an embodiment of the present invention.

Referring to FIG. 12, the memory system 1200 may include a memory device 1210 and a memory controller 1220.

The memory controller 1220 may control an operation of the memory device 1210 by applying command signals CMDs and addresses ADDs to the memory device 1210 and exchanges data DATA with the memory device 1210 in read and write operations. The memory controller 1220 may provide the command signals CMDs (e.g., an active command ACT, a precharge command PCG, a read command RD, a write command WT, or a refresh command REF) to the memory device 1210 by sending the command signals CMDs to the memory device 1210. When the active command ACT is input to the memory device 1210, the memory controller 1220 may send the addresses ADDs for selecting a cell block and a word line to be activated in the memory device 1210. The memory controller 1220 may periodically send the refresh command REF to the memory device 1210. The refresh command REF may include a normal refresh command NREF and a target refresh command TREF.

The memory device 1210 may be the memory device described, for example, with reference to FIG. 1. When the memory device 1210 is the memory device 100 of FIG. 1, the random sampling circuit 124 may sample an input address IADD, corresponding to the active command ACT at a random point of time, to generate a sampling address SAM_ADD. The target address generation circuit 130 may include a plurality of address storing circuits 210 suitable for storing the sampling address SAM_ADD as latch addresses LADD. When the target refresh command TREF is activated k times, where k is greater than 0, the target address generation circuit 130 may store the sampling address SAM_ADD as the latch address LADD in the k-th address storing circuit among the address storing circuits 210, while outputting the latch address LADD stored the (k−1)-th address storing circuit as the target address TADD. At this time, the target address generation circuit 130 may manage/control not to store the sampling address SAM_ADD in the address storing circuits 210 when the sampling address SAM_ADD is identical to any of the latch addresses LADD stored in the address storing circuits 210.

As described above, the memory system 1200 may manage the randomly sampled sampling address SAM_ADD not to be stored in the address storing circuit when the sampling address SAM_ADD is duplicated with any of the latch addresses LADD, and may perform a target refresh using the latch addresses LADD in the address storing circuit. Thus, it is possible to improve the efficiency of the target refresh operation by preventing unnecessary refresh operations from being performed according to the duplicated addresses.

While the present invention has been described with respect to the various embodiments, it will be apparent to those skilled in the art that various changes and modifications may be made without departing from the spirit and scope of the invention as defined in the following claims. For example, the logic gates and transistors illustrated in the above embodiments may be realized in different positions and types according to the polarity of an input signal.

What is claimed is:

1. A semiconductor memory device comprising:
   a cell array including a plurality of word lines;
   a plurality of address storing circuits suitable for sequentially storing a sampling address as one of a plurality of latch addresses, and sequentially outputting each of the latch addresses as a target address according to a refresh command;
   a duplication decision circuit suitable for preventing the sampling address from being stored in the address storing circuits when the sampling address is identical to any of the latch addresses stored in the address storing circuits; and
   a row control circuit suitable for refreshing one or more word lines based on the target address in response to the refresh command.

2. The semiconductor memory device of claim 1, further comprising a random sampling circuit suitable for generating the sampling address by sampling an active address inputted with an active command at a random point of time.

3. The semiconductor memory device of claim 2, wherein the random sampling circuit includes:
   an active latch suitable for storing an input address as an active address according to the active command; and
   a sampling latch suitable for outputting the active address as the sampling address according to a random sampling signal.

4. The semiconductor memory device of claim 1,
   further comprising a control signal generation circuit suitable for generating a counting signal and a sequential signal, and
   sequentially activating each bit of the counting signal and each bit of the sequential signal, in response to the refresh command.

5. The semiconductor memory device of claim 4, wherein each of the address storing circuits includes:
   a latch circuit suitable for storing the sampling address as the latch address according to a latch enable signal;
   a latch control circuit suitable for generating the latch enable signal according to a duplication decision signal and a corresponding bit of the counting signal;
   a comparison circuit suitable for outputting a match signal by comparing the sampling address with the latch address stored in the latch circuit; and
   an output control circuit suitable for outputting the latch address as the target address according to a corresponding bit of the sequential signal.

6. The semiconductor memory device of claim 5, wherein the duplication decision circuit enables the duplication decision signal when any of the match signals outputted from the address storing circuits is enabled.

7. The semiconductor memory device of claim 5, wherein the latch control circuit enables the latch enable signal when the duplication decision signal is disabled and the corresponding bit of the counting signal is activated.

8. The semiconductor memory device of claim 4, wherein the control signal generation circuit is further suitable for activating corresponding bits of the counting signal and the sequential signal at different points in time.

9. The semiconductor memory device of claim 4,
   wherein the control signal generation circuit includes a plurality of shift registers suitable for being coupled in series, and receiving an output signal of a shift register at a previous stage according to the refresh command,
   wherein an output signal of a shift register at a last stage is fed back to a shift register at a first stage, and
   wherein a k-th bit of the counting signal and a (k−1)-th bit of the sequential signal are outputted from a shift register at a k-th stage.

10. The semiconductor memory device of claim 1, wherein a (k−1)-th address storing circuit among the address storing circuits outputs the latch address as the target address while a k-th address storing circuit stores the sampling address as the latch address.

11. An address generation circuit comprising:
a plurality of address storing circuits suitable for storing a sampling address as one of a plurality of latch addresses according to a counting signal, and outputting each of the latch addresses as a target address according to a refresh command and a sequential signal;
a duplication decision circuit suitable for preventing the sampling address from being stored in the address storing circuits when the sampling address is identical to any of the latch addresses stored in the address storing circuits; and
a control signal generation circuit suitable for sequentially activating bits within the counting signal and sequentially activating bits within the sequential signal, in response to the refresh command.

12. The address generation circuit of claim 11, wherein the sampling address is generated by sampling an active address inputted with an active command at a random point in time.

13. The address generation circuit of claim 11, wherein each of the address storing circuits includes:
a latch circuit suitable for storing the sampling address as the latch address according to a latch enable signal;
a latch control circuit suitable for generating the latch enable signal according to a duplication decision signal and a corresponding bit of the counting signal;
a comparison circuit suitable for outputting a match signal by comparing the sampling address with the latch address stored in the latch circuit; and
an output control circuit suitable for outputting the latch address as the target address according to a corresponding bit of the sequential signal.

14. The address generation circuit of claim 13, wherein the duplication decision circuit enables the duplication decision signal when any of the match signals outputted from the address storing circuits is enabled.

15. The address generation circuit of claim 13, wherein the latch control circuit enables the latch enable signal when the duplication decision signal is disabled and the corresponding bit of the counting signal is activated.

16. The address generation circuit of claim 11,
wherein the control signal generation circuit includes:
a plurality of shift registers suitable for being coupled in series, and receiving an output signal of a shift register at a previous stage according to the refresh command,
wherein an output signal of a shift register at a last stage is fed back to a shift register at a first stage, and
wherein a k-th bit of the counting signal and a (k−1)-th bit of the sequential signal are outputted from a shift register at a k-th stage.

17. The address generation circuit of claim 11, wherein a (k−1)-th address storing circuit among the address storing circuits outputs the latch address as the target address while a k-th address storing circuit stores the sampling address as the latch address.

18. A method of operating a semiconductor memory device including a plurality of address storing circuits, the method comprising:
generating a duplication decision signal according to whether a sampling address is identical to any of a plurality of latch addresses stored in the address storing circuits;
sequentially storing the sampling address as one of the plurality of latch addresses in the address storing circuits according to a counting signal and the duplication decision signal; and
sequentially outputting the latch addresses as a target address according to a refresh command and a sequential signal and refreshing one or more word lines based on the target address.

19. The method of claim 18, further comprising generating the sampling address by sampling an active address inputted with an active command at a random point in time.

20. The method of claim 18, further comprising:
generating the counting signal and the sequential signal;
sequentially activating bits within the counting signal in response to the refresh command; and
sequentially activating bits within the sequential signal in response to the refresh command,
wherein corresponding bits of the counting signal and the sequential signal are activated at different points in time.

21. The method of claim 18, wherein a (k−1)-th address storing circuit among the address storing circuits outputs the latch address as the target address, while a k-th address storing circuit stores the sampling address as the latch address.

22. An operating method of a memory device, the operating method comprising:
selectively latching individual ones among sequentially provided addresses such that the latched addresses are different from one another; and
performing refresh operations on word lines indicated by a sequence of the latched addresses.

\* \* \* \* \*